United States Patent
Sperl et al.

(10) Patent No.: US 12,249,807 B2
(45) Date of Patent: Mar. 11, 2025

(54) LASER DEVICE AND METHOD FOR MANUFACTURING A LASER DEVICE

(71) Applicant: OSRAM Opto Semiconductors GmbH, Regensburg (DE)

(72) Inventors: Matthias Sperl, Mintraching (DE); Hubert Halbritter, Dietfurt-Toeging (DE); Peter Brick, Regensburg (DE); Philipp McCaw, Nittendorf (DE); Dennis Sprenger, Röthenbach a.d. Pegnitz (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 939 days.

(21) Appl. No.: 17/414,671

(22) PCT Filed: Dec. 18, 2019

(86) PCT No.: PCT/EP2019/085946
§ 371 (c)(1),
(2) Date: Jun. 16, 2021

(87) PCT Pub. No.: WO2020/127480
PCT Pub. Date: Jun. 25, 2020

(65) Prior Publication Data
US 2022/0021189 A1    Jan. 20, 2022

(30) Foreign Application Priority Data

Dec. 20, 2018 (DE) .................. 10 2018 133 217.3
Jan. 14, 2019 (DE) .................. 10 2019 100 794.1

(51) Int. Cl.
*H01S 5/42* (2006.01)
*G02B 1/00* (2006.01)
*G02B 27/09* (2006.01)
*H01S 5/02345* (2021.01)
*H01S 5/183* (2006.01)

(52) U.S. Cl.
CPC .............. *H01S 5/423* (2013.01); *G02B 1/002* (2013.01); *G02B 27/0922* (2013.01); *H01S 5/02345* (2021.01); *H01S 5/18341* (2013.01)

(58) Field of Classification Search
CPC .. H01S 5/423; H01S 5/02345; H01S 5/18341; H01S 5/02257; G02B 1/002;
(Continued)

(56) References Cited

U.S. PATENT DOCUMENTS 6,410,416 B1 * 6/2002 Dodabalapur ........ H01S 5/1231
438/749
2006/0039434 A1   2/2006 Coleman
(Continued)

FOREIGN PATENT DOCUMENTS

CN    1738117 A     2/2006
CN    101231357 A   7/2008
(Continued)

OTHER PUBLICATIONS

International Search Report (with English translation) and Written Opinion mailed Mar. 23, 2020 for corresponding International Application No. PCT/EP2019/085946 (Examiner, Unknown), 12 pages.

*Primary Examiner* — Xinning (Tom) Niu
(74) *Attorney, Agent, or Firm* — MH2 Technology Law Group LLP (57) ABSTRACT

A laser device comprises a carrier, an optoelectronic component provided on the carrier, said component being designed to emit laser radiation, and an optical element designed to form the laser radiation emitted by the optoelectronic component, wherein: the optical element has a first layer that is at least partially transparent to the laser radiation, with a first refractive index, and a second layer that is at least partially transparent to the laser radiation, with a second refractive index; the first layer being applied to the
(Continued)

optoelectronic component and having a surface with an imprinted structure; and the second layer is applied to the first layer, on the surface (24) having the imprinted structure.

16 Claims, 4 Drawing Sheets (58) Field of Classification Search
CPC .......................... G02B 27/0922; G02B 3/0043; G02B 3/0056; G02B 5/0278; G02B 5/1871; G02B 27/4233; H01L 2224/2405; H01L 2224/24101; H01L 2224/24105; H01L 2224/24226; H01L 2224/24998; H01L 2224/291; H01L 2224/32225; H01L 2224/73267
See application file for complete search history.

(56) References Cited

U.S. PATENT DOCUMENTS

| | | | |
|---|---|---|---|
| 2007/0091962 A1* | 4/2007 | Murakami | .......... H01S 5/18311 372/50.124 |
| 2013/0272330 A1* | 10/2013 | Joseph | .................... H01S 5/023 372/36 |
| 2013/0341784 A1* | 12/2013 | Lin | .......................... H01L 21/78 257/737 |
| 2014/0030829 A1 | 1/2014 | Braune et al. | |
| 2014/0034983 A1 | 2/2014 | Gebuhr et al. | |
| 2016/0284920 A1* | 9/2016 | Saugier | ............... H01L 31/0203 |

FOREIGN PATENT DOCUMENTS

| | | | | |
|---|---|---|---|---|
| CN | 102165588 A | 8/2011 | | |
| CN | 103348498 A | 10/2013 | | |
| DE | 69428578 T2 | 6/2002 | | |
| DE | 10163117 C1 | 1/2003 | | |
| DE | 102005016052 A1 * | 3/2006 | .......... | H01L 31/167 |
| DE | 102013106689 A1 | 12/2014 | | |
| DE | 102017100997 A1 | 7/2018 | | |
| DE | 102017112235 A1 | 12/2018 | | |
| WO | 2012031932 A1 | 3/2012 | | |
| WO | 2018134086 A1 | 7/2018 | | |
| WO | 2018147963 A1 | 8/2018 | | |

* cited by examiner

LASER DEVICE AND METHOD FOR MANUFACTURING A LASER DEVICE

CROSS-REFERENCE TO RELATED APPLICATIONS

The present application is a national phase entry of PCT/EP2019/085946 filed on Dec. 18, 2019, published as WO 2020/127480 on Jun. 25, 2020, and claims the priorities of German Patent Application No. 10 2018 133 217.3, filed with the German Patent and Trademark Office on Dec. 20, 2018, and German Patent Application No. 10 2019 100 794.1, filed with the German Patent and Trademark Office on Jan. 14, 2019. The disclosure content of German Patent Application Nos. 10 2018 133 217.3 and 10 2019 100 794.1 is hereby incorporated by reference into the disclosure content of the present application.

FIELD

The present invention relates to a laser device and a method for manufacturing a laser device.

BACKGROUND

The use of optoelectronic components for generating laser radiation, such as laser diodes or VCSELs (vertical-cavity surface-emitting lasers), in consumer products requires measures to comply with eye safety standards. It must be ensured that an optical element for shaping the laser radiation, such as diffractive optics, is firmly connected to a laser device. Meeting these requirements implies higher system complexity and manufacturing costs.

The present invention is based, among other things, on the object of creating a laser device which can be manufactured inexpensively and is eye-safe, having an optoelectronic component for generating laser radiation and an optical element for shaping the laser radiation. Furthermore, a method for manufacturing such a laser device is to be disclosed.

SUMMARY

An object of the invention is solved by a laser device having the features of claim 1. An object of the invention is further solved by a method for manufacturing a laser device having the features of independent claim 9. Preferred embodiments and further developments of the invention are indicated in the dependent claims.

A laser device according to one embodiment comprises a carrier, at least one optoelectronic component arranged on the carrier, and an optical element arranged on the optoelectronic component.

The optoelectronic component is configured to emit laser radiation during operation of the laser device. The optical element is arranged in the beam path of the laser radiation emitted by the optoelectronic component and is configured to shape the laser radiation emitted by the optoelectronic component.

The optical element comprises a first layer having a first refractive index and a second layer having a second refractive index, the first and second refractive indices being different.

Both the first layer and the second layer are at least partially transparent to the laser radiation emitted by the optoelectronic component, or are each made of a material that is at least partially transparent to the laser radiation emitted by the optoelectronic component. Partially transparent in this context means that the first and the second layer partially transmit the radiation emitted by the optoelectronic component and accordingly absorb it to a certain extent. Of course, it is also possible that the first and/or the second layer are substantially transparent, so that the laser radiation is absorbed, if at all, only very slightly by the respective layer.

The first layer is applied to the optoelectronic component and comprises a surface with an imprinted three-dimensional structure, in particular a microstructure or nanostructure. The second layer is applied to the first layer. In particular, the second layer is applied directly to the surface of the first layer with the imprinted structure. Accordingly, the second layer takes up the three-dimensional structure of the first surface at the interface to the first layer.

The first layer can, for example, be applied directly to the optoelectronic component. Alternatively, an intermediate layer, in particular exactly one intermediate layer or several intermediate layers, can be located between the optoelectronic component and the first layer. The intermediate layer may be at least partially or substantially transparent to the laser radiation emitted by the optoelectronic component. The intermediate layer may serve for refractive index matching between the optoelectronic component and the first layer. The intermediate layer may have a refractive index that is between the refractive index of the top layer of the optoelectronic component and the refractive index of the first layer. For example, the intermediate layer may be a silicone layer. The intermediate layer may be applied directly to the optoelectronic component, and the first layer may be applied directly to the intermediate layer so that there is no air or gas gap between the optoelectronic component and the first layer.

According to another alternative embodiment, the first layer of the optical element may be spaced apart from the optoelectronic component and an air or gas gap may be located between the optoelectronic component and the first layer. For example, the optoelectronic component may be housed in a package having sidewalls and the optical element may be disposed on the sidewalls such that an air or gas gap is located between the optoelectronic component and the first layer of the optical element. The optical element formed from the first and second layers may comprise a planar or flat bottom surface and a planar or flat top surface. In this case, the bottom surface of the optical element is formed by the bottom surface of the first layer and the top surface of the optical element is formed by the top surface of the first layer.

Both the first layer and the second layer may each be made of a polymer or a material containing a polymer. For example, silicones can be used as materials for the first and/or the second layer.

The first and second layers can be applied, for example, by means of a spraying, injection, dispensing or molding process.

After the first layer has been applied to the optoelectronic component and to any other components of the laser device, the three-dimensional structure can be introduced into the first layer by means of an imprint or embossing method. This can be done, for example, by means of a suitable stamp or by means of a roller which has the corresponding negative imprint and under which the carrier with the optoelectronic component and the applied first layer is pulled through. Subsequently, the second layer can be applied to the first layer. The first and second layers can be cured in a suitable manner, for example by means of UV radiation and/or thermally.

The first layer may have a height or thickness in the range of 10 µm to 100 µm above the maximum topography level of the underlying structure. The second layer can also have a height or thickness in the range of 10 µm to 100 µm.

The laser radiation emitted by the optoelectronic component first passes through the first layer and then through the second layer.

The optical element is formed by the first and the second layer as well as the structured interface between the first and the second layer. The surface of the first layer with the imprinted structure can, for example, have structures with dimensions in the nanometer and/or micrometer range. Consequently, the dimensions of the structures may be larger or also smaller than the wavelength of the emitted laser radiation. It may be provided, for example, that no dimension of the imprinted structure is larger than 500 nm or 1 µm or 10 µm or 100 µm or 200 µm or 500 µm.

The optical element may comprise, for example, a diffractive optical element. A diffractive optical element (DOE) is an optical element for shaping a light beam, in particular a laser beam. The physical principle is flexion, also called diffraction, at an optical grating. Furthermore, the optical element may comprise a diffuser, in particular a specially designed diffuser (engineered diffuser), microlenses, pyramid-shaped structures and/or meta-optical structures. Furthermore, a regular arrangement, also called array, of lenses, diffractive optical elements and/or other optics or structures can be used, for example a micro lens array (MLA).

The optoelectronic component can, for example, be a laser diode, i.e., a semiconductor component that generates laser radiation. Furthermore, the optoelectronic component can be a VCSEL, also called a surface emitter. A VCSEL is a laser diode in which the light is emitted perpendicular to the plane of the semiconductor chip, as opposed to an edge-emitting laser diode in which the light emerges from one or two edges of the semiconductor chip. The use of an edge-emitting laser diode as an optoelectronic component is also conceivable. Furthermore, it is possible that the laser device contains exactly one optoelectronic component or several optoelectronic components.

The laser radiation emitted by the optoelectronic component may be, for example, laser radiation in the visible range, ultraviolet (UV) light, and/or infrared (IR) light. The optoelectronic component may further be part of an integrated circuit.

In addition to the optoelectronic component, other components and/or parts can be integrated into the laser device.

The laser device may be a so-called chip-scale package (CSP), also called chip-scaled package. The term "chip-scale package" is a technical term in common use by those skilled in the art and refers to a device having a semiconductor chip integrated therein, which in the present application is given by the optoelectronic component, in the scale of the semiconductor chip. For example, a chip-scale package may be defined such that a main surface area of the chip-scale package is at most 20% larger than a main surface area of the semiconductor chip included in the chip-scale package.

The laser device described herein can be used in any laser or VCSEL application. In particular, the laser device can be used in consumer products, also called consumer goods or consumer products.

The use of the optical element described here allows the structured surface of the first layer to be "buried" under the second layer, thereby protecting the structure of the first layer. When positioning the laser device on a carrier by means of a positioning system or an automatic placement machine, the second layer prevents possible damage to the structured surface of the first layer.

Furthermore, the laser device ensures a high level of eye safety, since the optical element is firmly connected to the optoelectronic component.

The laser device can be manufactured by only a few process steps and consequently comparatively cheaply. In particular, the laser device can be manufactured in a batch process, also called batch process. Furthermore, the laser device can be manufactured with an extremely compact design.

The dimensions of the structured surface can be designed to be comparatively small, which further reduces manufacturing costs.

Since the laser device does not require an external optical element to shape the laser beam, the air/glass interface at the entrance side of the laser beam into the external optical element is eliminated.

Depending on the application and desired beam shaping, either the first refractive index of the first layer or the second refractive index of the second layer may be the greater refractive index. For example, the two refractive indices may differ by at least 0.1 or at least 0.2 or at least 0.4.

The design of the optical element makes it possible to design the surface of the second layer, which faces away from the first layer and thus the structured surface, planar or flat.

The carrier on which the optoelectronic component is mounted may comprise conductive paths and/or electrical vias that can be used to electrically contact the optoelectronic component. The underside of the carrier may be a mounting surface with which the laser device can be soldered to a carrier.

The carrier can be, for example, a printed circuit board (PCB), circuit card, circuit board or printed circuit. A printed circuit board consists of electrically insulating material with conductive paths adhering to it. Fiber-reinforced plastic can be used as the electrically insulating material. For example, the electrically insulating material may be glass fibers embedded in an epoxy or silicone resin. The printed circuit board traces can be etched from a thin layer of copper.

Furthermore, the carrier can also be a leadframe made of a suitable metal, for example copper, which is overmolded with a potting material, in particular a plastic. Other carriers are also conceivable, for example carriers made of ceramic.

The optoelectronic component comprises a first main surface and a second main surface opposite the first main surface, wherein the optoelectronic component is attached to the carrier with its first main surface. According to one embodiment, the optoelectronic component comprises at least one first electrical contact element on its first main surface and at least one second electrical contact element on its second main surface. According to an alternative embodiment, the optoelectronic component has a so-called flip-chip configuration, i.e., all electrical contact elements are arranged on the first main surface facing the carrier.

The optoelectronic component may be embedded in an electrically insulating material. For example, the height of the electrically insulating material may be substantially the same as the height of the side edges of the optoelectronic component such that the top surface of the layer of electrically insulating material is substantially flush with the second main surface of the optoelectronic component.

An electrically conductive layer, consisting in particular of one or more conductive paths, may be deposited on the electrically insulating material. The electrically conductive layer may extend to the second main surface of the optoelectronic component to contact the second electrical contact element. The electrically conductive layer may, for example, be electrodeposited and comprise one or more suitable metals. Therefore, the use of bonding wires for contacting the optoelectronic component can be omitted, which allows a compact height of the laser device.

The second electrical contact element may be electrically coupled via the electrically conductive layer to a conductive path and/or an electrical via of the carrier. Holes may be drilled in the electrically insulating embedding material through which contact surfaces of the carrier are exposed. In this case, the electrically conductive layer may extend from the contact surfaces of the carrier to the second electrical contact element of the optoelectronic component. Alternatively, one or more electrically conductive elements having a height equal to the height of the electrically insulating embedding material may be embedded in the embedding material. The electrically conductive elements may provide an electrical connection between the electrically conductive layer deposited on the embedding material and the contact surfaces of the carrier.

A method according to one embodiment is for manufacturing a laser device. The method provides that at least one optoelectronic component configured to emit laser radiation is arranged on a carrier, and an optical element configured to shape the laser radiation emitted by the optoelectronic component is applied to the optoelectronic component. The optical element comprises a first layer with a first refractive index that is at least partially transparent to the laser radiation and a second layer with a second refractive index that is at least partially transparent to the laser radiation. In particular, the first layer is applied directly to the optoelectronic component. A structure is imprinted into a surface of the first layer. The second layer is applied to the surface with the imprinted structure of the first layer.

The method for manufacturing a laser device may comprise the laser device embodiments described above.

The structure can be imprinted into the surface of the first layer after the first layer is applied to the optoelectronic component.

Furthermore, the structure can be imprinted into the surface of the first layer by means of a stamp or roller, with the corresponding negative imprint on the stamp or roller.

The second layer can comprise a planar or flat surface after application.

The optoelectronic component can be embedded in an electrically insulating material after being placed on the carrier.

An electrically conductive layer can be deposited on the optoelectronic component and the electrically insulating material. The electrically conductive layer can be electrically coupled to the optoelectronic component and conductive paths and/or vias of the carrier.

The electrically conductive layer can be deposited by electroplating. For this purpose, a seed layer can first be deposited, for example by sputtering, which is then structured. The seed layer can then be galvanically reinforced.

A batch process can be used to manufacture the laser device. In this process, a plurality of optoelectronic components configured to emit laser radiation are arranged on the carrier. Then, the first layer as well as the second layer are applied to the plurality of optoelectronic components. For separating the laser devices, at least some of the optoelectronic components are separated from each other, for which purpose the carrier, the first and the second layer as well as possibly further layers are cut through.

BRIEF DESCRIPTION OF THE DRAWINGS

In the following, embodiments of the invention are explained in more detail with reference to the accompanying drawings. In these schematically show.

DETAILED DESCRIPTION

In the following detailed description, reference is made to the accompanying drawings, which form a part of this description and in which specific embodiments in which the invention may be practiced are shown for illustrative purposes. Since components of embodiments may be positioned in a number of different orientations, the directional terminology is for illustrative purposes and is not limiting in any way. It is understood that other embodiments may be used and structural or logical changes may be made without departing from the scope of protection. It is understood that the features of the various embodiments described herein may be combined with each other, unless specifically indicated otherwise. Therefore, the following detailed description is not to be construed in a limiting sense. In the figures, identical or similar elements are provided with identical reference signs where appropriate.

Figure 1:
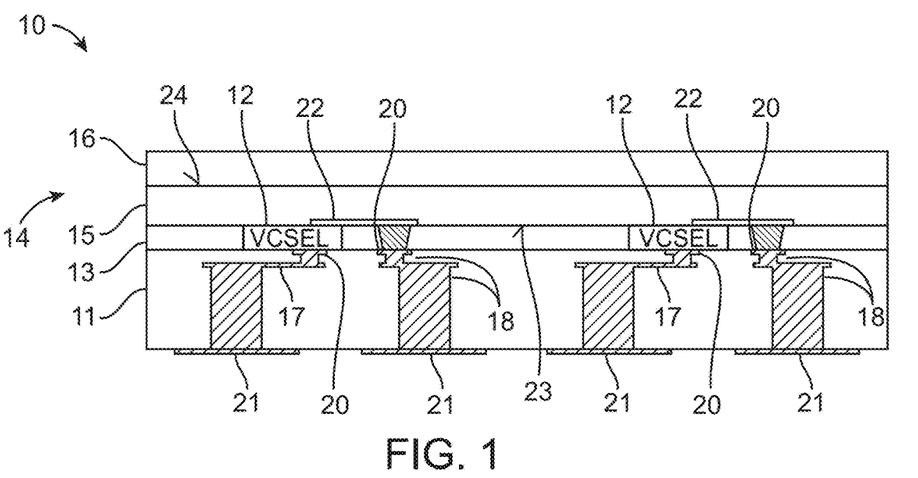
FIG. 1 an illustration of an embodiment of a laser device.

FIG. 1 schematically shows a laser device 10 comprising a carrier 11, a plurality of optoelectronic components 12, an electrically insulating layer 13, and an optical element 14 consisting of a first layer 15 and a second layer 16.

The laser device 10 may be in the form of a chip-scale package (CSP), although it should be noted that the dimensions in FIG. 1 are not necessarily reproduced to scale.

In the present embodiment, the carrier 11 is a two-layer printed circuit board with conductive paths 17 and vias 18. The conductive paths 17 and vias 18 electrically connect contact elements 20 arranged on the top surface of the carrier 11 to contact elements 21 arranged on the bottom surface of the carrier 11. The bottom surface of the carrier 11 serves as a mounting and/or connection surface of the laser device 10. The laser device 10 can be mounted, in particular soldered, to an external component with the bottom surface of the carrier 11.

In the present embodiment, the laser device 10 comprises two optoelectronic components 12 configured as VCSELs. Alternatively, the laser device 10 may comprise another number of optoelectronic components 12 configured to emit laser radiation.

The optoelectronic components 12 are embedded in the electrically insulating layer 13 and are further electrically connected to the conductive paths 17 and vias 18 via conductive paths 22.

The first layer 15 and the second layer 16 of the optical element 14 are substantially transparent to the laser radiation generated by the optoelectronic components 12. The first layer 15 has a first refractive index, while the second layer 16 has a second refractive index different therefrom.

A surface 23 of the first layer 15 of the optical element 14 facing toward the optoelectronic components 12 is directly applied to the optoelectronic components 12 at least in a region of the optoelectronic components 12. Furthermore, a three-dimensional structure is imprinted in the surface 24 of the first layer 15 facing away from the optoelectronic components 12.

Examples of the three-dimensional structure imprinted in the surface 24 of the first layer 15 of the optical element 14 are shown in FIGS. 2A to 2D.

Figure 2A:
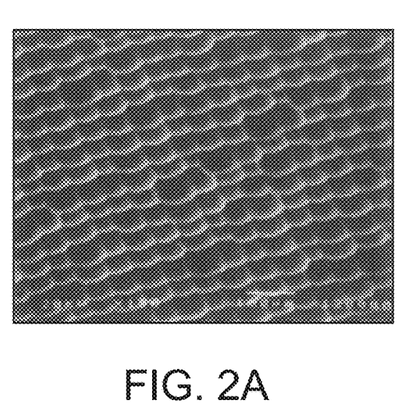
FIG. 2A to 2D illustrations of various three-dimensional structures imprinted into a surface.

FIG. 2A shows a specially designed diffuser (engineered diffuser) whose structures have dimensions in the micrometer range and are therefore significantly larger than the wavelength of the laser radiation emitted by the optoelectronic components 12.

Figure 2B:
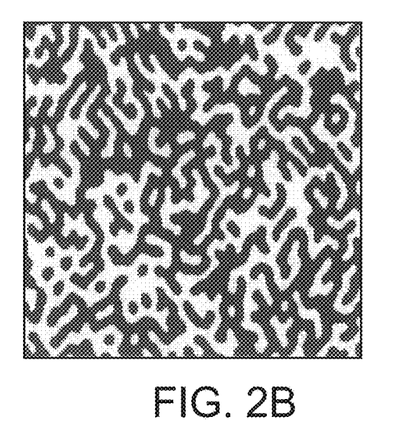

FIG. 2B shows a diffractive structure of a diffractive optical element (DOE). The heights of the structures are in the range of 700 nm to 1000 nm. The structure widths are in the range of 100 nm.

Figure 2C:
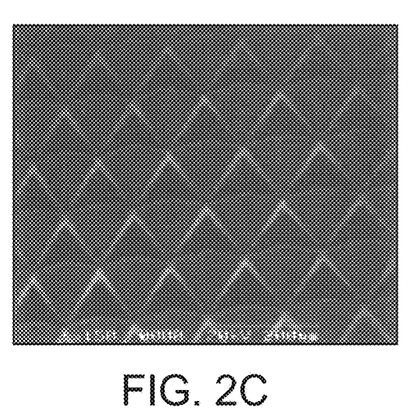

FIG. 2C shows a pyramid-shaped structure with dimensions in the micrometer range.

Figure 2D:
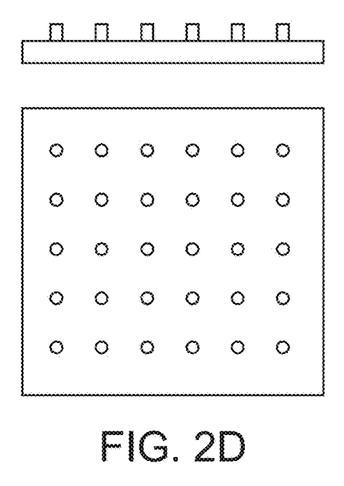

FIG. 2D shows a meta-optical structure in a top view in the lower illustration and in a cross-section in the upper illustration. The meta-optics structure contains a plurality of pillars with lateral dimensions in the range of about 100 nm. The columns can be made of titanium dioxide, for example.

It is also conceivable to combine the structures shown in FIGS. 2B and 2D. For example, the white areas in FIG. 2B may represent titanium dioxide columns with a larger spacing, while the titanium dioxide columns in the black areas of FIG. 2B have a smaller spacing.

FIGS. 3A to 3D schematically show a method for manufacturing the laser device 10 shown in FIG. 1.

Figure 3A:
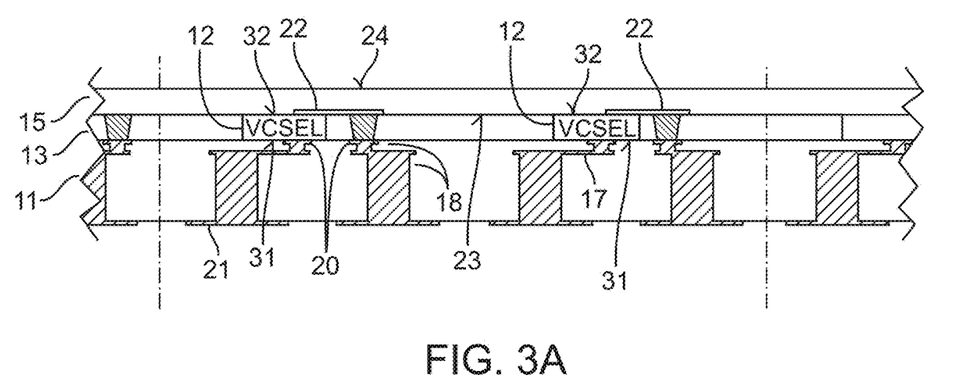
FIGS. 3A to 3D illustrations of an embodiment of a method for manufacturing a laser device.

FIG. 3A shows a section of a large-area carrier 11, which may have, for example, a size of 70 mm×125 mm and a thickness in the range of about 200 µm to 600 µm. During the manufacturing process, several of these beams 11 may be arranged on a steel beam not shown in FIG. 3A, which may have, for example, a size of 300 mm×450 mm and a thickness in the range of 600 µm. However, other dimensions for the carrier 11 and the steel carrier are also possible.

The optoelectronic components 12 each comprise a first electrical contact element on their first main surface 31 and a second electrical contact element on the opposite second main surface 32. The optoelectronic components 12 are soldered with their first main surface 31 onto corresponding contact elements 20 of the carrier 11.

Subsequently, the optoelectronic components 12 are embedded in the electrically insulating layer 13, which may, for example, consist of an epoxy matrix with glass particles. The electrically insulating layer 13 covers the side surfaces of the optoelectronic components 12, but not the second main surfaces 32. The height of the electrically insulating layer 13 can correspond to the height of the optoelectronic components 12 and can be in the range of 10 µm to 20 µm, for example.

Contacting of the second electrical contact elements arranged on the second main surface 32 of the optoelectronic components 12 can be performed in various ways. Examples of this are shown in FIGS. 3B and 3C.

Figure 3B:
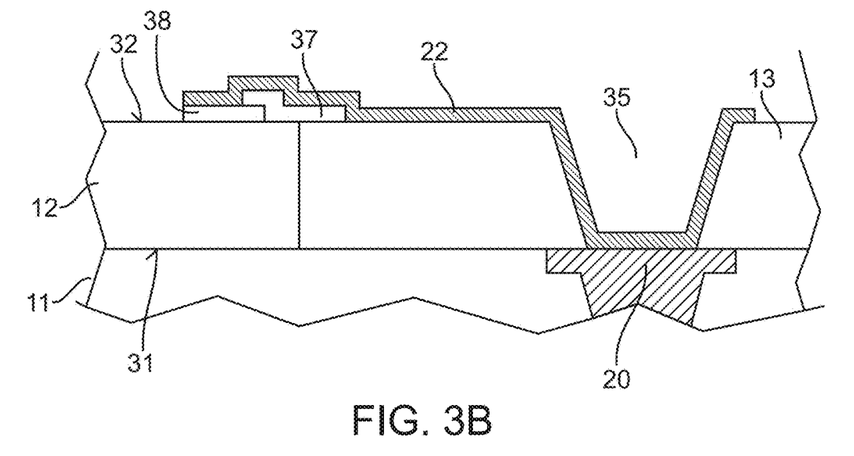

In the variant shown in FIG. 3B, holes 35 are first drilled in the electrically insulating layer 13 above contact elements 20 of the carrier 11. Furthermore, an electrically insulating layer 37 is applied to the chip edge. Subsequently, the conductive paths 22 are applied in such a way that they each connect a second contact element 38 of an optoelectronic component 12 to a contact element 20 of the carrier 11 exposed by one of the holes 35.

To manufacture the conductive paths 32, a seed layer can first be sputtered on, which is structured and then galvanically reinforced. The paths 32 can, for example, have a width in the range from 35 µm to 50 µm and a height or thickness in the range from 10 µm to 20 µm.

Figure 3C:
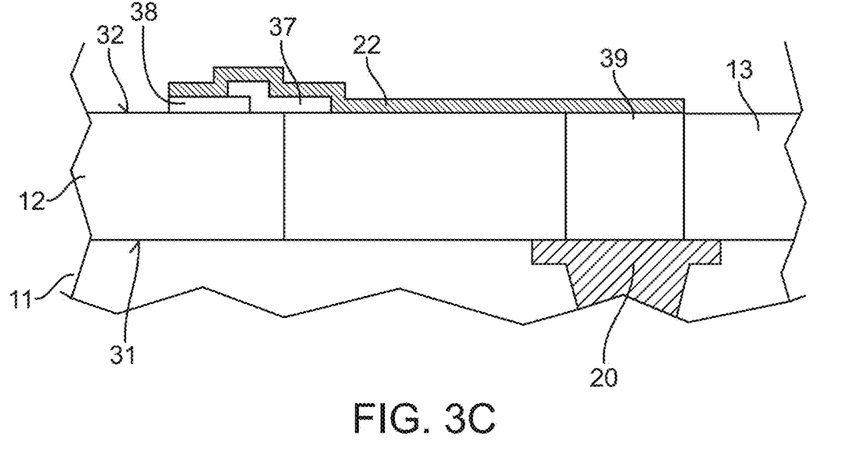

The variant shown in FIG. 3C differs from the variant shown in FIG. 3B in that no holes 35 are drilled in the electrically insulating layer 13. Instead, electrically conductive elements 39, for example made of metal, are placed on or soldered to the corresponding contact elements 20 of the carrier 11 before the electrically insulating layer 13 is applied. The electrically conductive elements 39 are embedded in the electrically insulating layer 13 together with the optoelectronic components 12, leaving the top surface of the electrically conductive elements 39 exposed. The top surface of the electrically conductive elements 39 can then be contacted with the conductive path 22.

After application of the conductive path 22, the first layer 15 is applied, for example, by means of a spraying, injection, dispensing or molding process. The first layer 15 may have a height or thickness in the range of 10 to 100 µm above the conductive path 22. The first layer 15 may be made of a polymer, for example a silicone.

Even before the material of the first layer 15 has cured, a stamp or roller is used to imprint the three-dimensional structure into the surface 24 of the first layer 15.

Figure 3D:
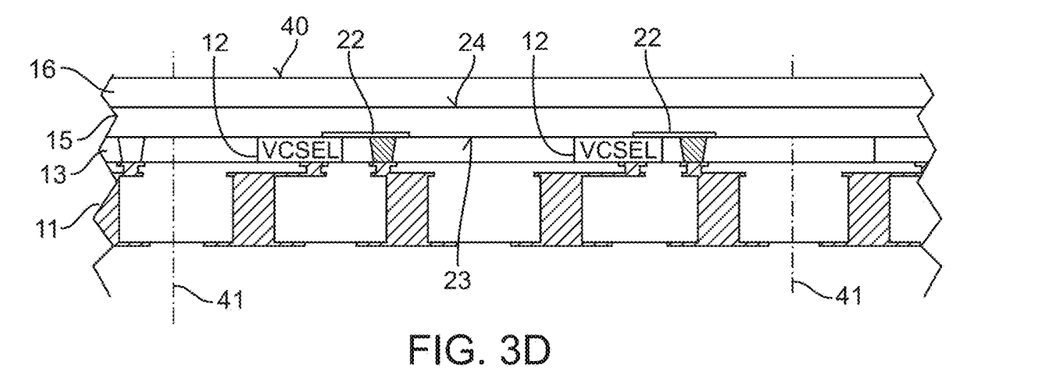

Thereafter, the second layer 16 is applied to the surface 24 of the first layer 15 by, for example, a spraying, injection, dispensing or molding process, as shown in FIG. 3D. The second layer 16 may also be made of a polymer, for example a silicone. The surface 40 of the second layer 16 is planar.

The laser devices 10 are then separated. For this purpose, the respective layers are cut along the dashed lines 41 drawn in FIG. 3D, for example by means of sawing.

Figure 4A:
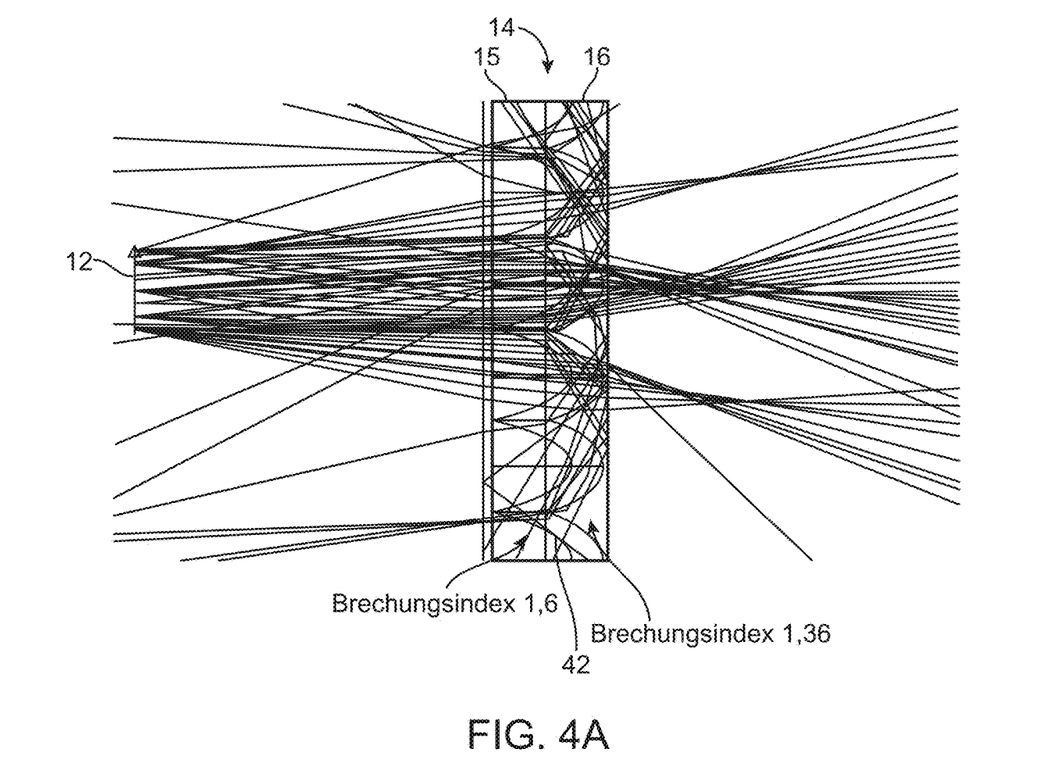
FIGS. 4A and 4B illustrations of different optical elements.
Figure 4B:
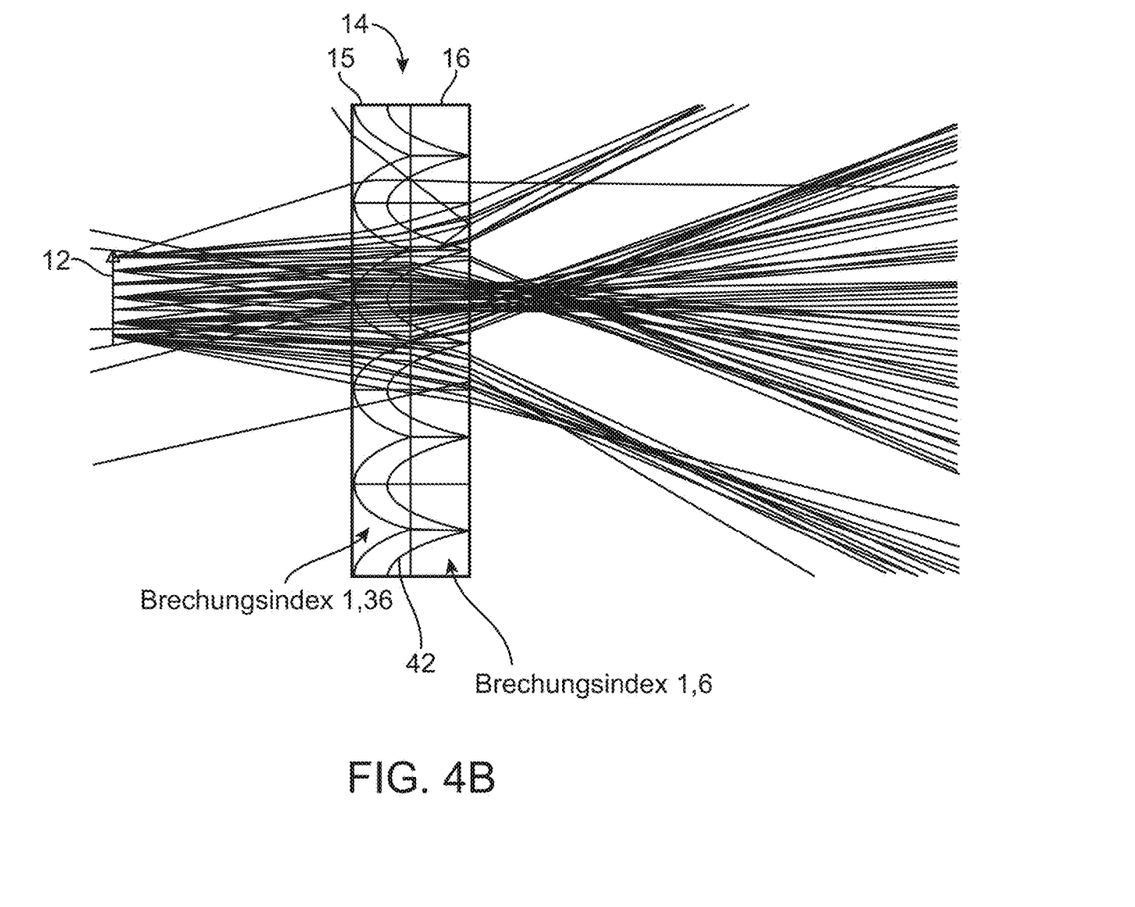

FIGS. 4A and 4B show examples of two differently configured optical elements 14 and the far field generated by the optical elements 14 when a laser beam generated by a plurality of optoelectronic components 12 is passed through the optical elements 14.

The optical elements 14 shown in FIGS. 4A and 4B each contain a transparent first layer 15 and a transparent second layer 16. In FIG. 4A, the first layer 15 has a larger refractive index of 1.6 than the second layer 16 of 1.36. In FIG. 4B, the refractive indices of the two layers 15 and 16 are reversed compared to FIG. 4A. The three-dimensional interface between the two layers 15 and 16 is shown by contour lines 42 in FIGS. 4A and 4B.

The invention claimed is:
1. A laser device comprising:
  a carrier;
  an optoelectronic component arranged on the carrier, which is configured to emit laser radiation; and
  an optical element configured to shape the laser radiation emitted by the optoelectronic component,
  wherein the optical element comprises a first layer at least partially transparent to the laser radiation and having a first refractive index and a second layer at least partially transparent to the laser radiation and having a second refractive index,
  wherein the first layer is applied to the optoelectronic component and comprises a surface with an imprinted structure,
  wherein the second layer is applied to the surface comprising the imprinted structure of the first layer, and
  wherein the optoelectronic component is embedded in a layer of electrically insulating material and the height of the electrically insulating material substantially cor- responds to the height of the side edges of the optoelectronic component such that the top surface of the layer of electrically insulating material is substantially flush with a main surface of the optoelectronic component.

2. The laser device according to claim 1, wherein the first refractive index and the second refractive index differ by at least 0.1.

3. The laser device according to claim 1, wherein the second layer comprises a planar surface.

4. The laser device according claim 1, wherein the carrier comprises conductive paths and/or electrical vias.

5. The laser device according claim 1, wherein the optoelectronic component comprises a first electrical contact element on a first main surface and a second electrical contact element on a second main surface opposite to the first main surface, and wherein the optoelectronic component has its first main surface facing the carrier and the second main surface is that main surface of the optoelectronic component which is substantially flush with the top surface of the layer of electrically insulating material.

6. The laser device according to claim 5, wherein an electrically conductive layer is deposited on the electrically insulating material, the electrically conductive layer contacting the second electrical contact element.

7. The laser device according to claim 6, wherein the second electrical contact element is electrically coupled via the electrically conductive layer to a conductive path and/or an electrical via of the carrier.

8. The laser device according claim 1, wherein the first layer is applied directly to the optoelectronic component or an intermediate layer is located between the optoelectronic component and the first layer.

9. A method for manufacturing a laser device, wherein
an optoelectronic component, which is configured to emit laser radiation, is arranged on a carrier, and
an optical element, which is configured to shape the laser radiation emitted by the optoelectronic component, is applied to the optoelectronic component,
wherein the optical element comprises a first layer at least partially transparent to the laser radiation and having a first refractive index and a second layer at least partially transparent to the laser radiation and having a second refractive index,
wherein the first layer is applied to the optoelectronic component and comprises a surface with an imprinted structure,
wherein the second layer is applied to the surface comprising the imprinted structure of the first layer, and
wherein the optoelectronic component is embedded in a layer of electrically insulating material and the height of the electrically insulating material substantially corresponds to the height of the side edges of the optoelectronic component such that the top surface of the layer of electrically insulating material is substantially flush with a main surface of the optoelectronic component.

10. The method according to claim 9, wherein the structure is imprinted into the surface of the first layer after the first layer is applied to the optoelectronic component.

11. The method according to claim 9, wherein the structure is imprinted into the surface of the first layer by a stamp or a roller.

12. The method according to claim 9, wherein the second layer comprises a planar surface.

13. The method according to claim 9, wherein the optoelectronic component is embedded in the electrically insulating material after being arranged on the carrier.

14. The method according to claim 13, wherein an electrically conductive layer is deposited on the optoelectronic component and the electrically insulating material, and the electrically conductive layer is electrically coupled to the optoelectronic component and conductive paths and/or vias of the carrier.

15. The method according to claim 14, wherein the electrically conductive layer is electrodeposited.

16. The method according to claim 9, wherein a plurality of optoelectronic components configured to emit laser radiation are arranged on the carrier, and the first layer and the second layer are applied to the plurality of optoelectronic components, and wherein at least some of the optoelectronic components are separated from each other after the first and second layers are applied.

* * * * *